United States Patent
Atsumi

(10) Patent No.: US 9,906,229 B2
(45) Date of Patent: Feb. 27, 2018

(54) PHASE LOCKED LOOP CIRCUIT AND PHASE LOCKED LOOP METHOD

(71) Applicant: FUJITSU LIMITED, Kawasaki-shi, Kanagawa (JP)

(72) Inventor: Ken Atsumi, Sendai (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/094,689

(22) Filed: Apr. 8, 2016

(65) Prior Publication Data
US 2016/0315626 A1   Oct. 27, 2016

(30) Foreign Application Priority Data

Apr. 27, 2015   (JP) .................................. 2015-090894

(51) Int. Cl.
*H03L 7/093*   (2006.01)
*H03L 7/107*   (2006.01)

(52) U.S. Cl.
CPC ............ *H03L 7/093* (2013.01); *H03L 7/1075* (2013.01)

(58) Field of Classification Search
CPC ......... H03L 7/00; H03L 7/087; H03L 7/0891; H03L 7/093; H03L 7/10; H03L 7/1075; H03L 7/18
See application file for complete search history.

(56) References Cited

U.S. PATENT DOCUMENTS

2014/0062549 A1*   3/2014   Navid .................... G11C 7/222
                                                            327/156
2016/0269171 A1*   9/2016   Sakurai ................ H03L 7/0991

FOREIGN PATENT DOCUMENTS

JP   04-100412 A   4/1992
JP   07-142999 A   6/1995

* cited by examiner

*Primary Examiner* — Lincoln Donovan
*Assistant Examiner* — David Mattison
(74) *Attorney, Agent, or Firm* — Arent Fox LLP

(57) ABSTRACT

A phase locked loop circuit including: a loop filter having a high cutoff characteristic and a low cutoff characteristic that are switchable, and a switching circuit configured to: detect a timing when an irregular gap of no signal, included in a input signal, does not occur, and switch, in the detected timing, a cut off characteristic of the loop filter from the high cutoff characteristic during entrainment of phase locking of a output signal with the input signal to the low cut off characteristic after the phase locking.

8 Claims, 21 Drawing Sheets

FIG. 14A  DE-MAPPING DATA & CLOCK
FIG. 14B  JITTERED CLOCK
FIG. 14C  RECOVERED CLIENT CLOCK & DATA

PHASE LOCKED LOOP CIRCUIT AND PHASE LOCKED LOOP METHOD

CROSS-REFERENCE TO RELATED APPLICATION

This application is based upon and claims the benefit of priority of the prior Japanese Patent Application No. 2015-090894, filed on Apr. 27, 2015, the entire contents of which are incorporated herein by reference.

FIELD

The embodiments discussed herein are related to a phase locked loop circuit and a phase locked loop method.

BACKGROUND

A phase locked loop (PLL) circuit is a circuit for generating an output signal locked with a phase of an input signal (a reference signal: REFCLK) input from outside. The PLL circuit has a function of removing a noise of a phase fluctuation component superimposed on the input signal, such as a so-called jitter or phase noise, and outputs the output signal from which a noise component is removed. A characteristic of the jitter noise removal has a low pass filter (LPF) characteristic, and a jitter noise having a frequency component greater than or equal to a cutoff frequency defined as a design parameter of the PLL is removed. In order to sufficiently remove a jitter noise, a setting of a lower cutoff frequency characteristic is desirable.

The PLL circuit is a type of automatic control loop circuit that causes a phase of the output signal to follow up the phase of the input signal, and the above-mentioned cutoff frequency corresponds to a loop band of automatic control. A speed of a response characteristic increases with an increase in the loop band in the automatic control. If the speed of the response characteristic is high, a time period taken to lock the phase of the output signal of the PLL with REFCLK serving as the input signal, in other words, a lock time is reduced.

In each of various kinds of systems utilizing the PLL, usually a time period taken to put a circuit into a steady state is desired to be shorter. Therefore, it is desirable that the above-mentioned lock time is as short a time period as possible. In this case, the cutoff frequency is set high. On the other hand, from a viewpoint of removal of the jitter noise superimposed on the input signal, it is desirable that the cutoff frequency is lower. In this way, in the PLL circuit, for a setting request for the cutoff frequency, a trade-off relationship between the characteristics of the noise removal and the response speed occurs. In order to fulfill conflicting requests, there is used a technology for switching between loop characteristics in such a manner that a high cutoff characteristic is selected to lock a phase with an input signal at the time of activating a circuit or the like and a low cutoff characteristic is selected at the time of being steady after the phase locking.

As the PLL circuit that switches between the loop characteristics, there is, for example, a technology for determining a convergence state of phase locking, based on a control voltage value of a voltage controlled oscillator (VCO) for generating a frequency of the output signal of the PLL circuit, and switching filter coefficients after the elapse of a given period of time (see, for example, Japanese Laid-open Patent Publication No. 7-142999). In addition, there is a technology for providing a phase comparator for loop filter switching determination, determining, based on an output of the phase comparator, a convergence state of phase locking, and switching filter coefficients (see, for example, Japanese Laid-open Patent Publication No. 4-100412).

SUMMARY

According to an aspect of the invention, a phase locked loop circuit including: a loop filter having a high cutoff characteristic and a low cutoff characteristic that are switchable, and a switching circuit configured to: detect a timing when an irregular gap of no signal, included in a input signal, does not occur, and switch, in the detected timing, a cut off characteristic of the loop filter from the high cutoff characteristic during entrainment of phase locking of a output signal with the input signal to the low cut off characteristic after the phase locking.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 14A to 14D are graphic charts for explaining generation of a gapped clock;

DESCRIPTION OF EMBODIMENTS

In clock regeneration in an optical transport network (OTN) transmission device or the like compliant with wavelength division multiplex (WDM) transmission in recent years, it is desirable that a phase is locked with an input signal including a gap (a gap, which indicates no signal). At this time, influence of a gap interval included in the input signal causes a phase jump. This phase jump influences a characteristic in a locking process of a PLL having a loop filter switching function.

The gap of the input signal occurs on an irregular base. Therefore, depending on the timing of an input gap, in some cases, phase locking is lost once and is re-converged after switching of filter coefficients. If loop switching is performed in a state in which a phase variation is not sufficiently converged before the switching of the filter coefficients, the phase variation after the switching of the filter coefficients becomes large.

In a configuration in which, in such a manner as in, for example, Japanese Laid-open Patent Publication No. 4-100412, a converging phase state is determined by using a phase comparator, the influence of a gap causes a phase-converged state to be difficult to determine. In addition, in a configuration in which, in such a manner as in, for example, Japanese Laid-open Patent Publication No. 7-142999, a control voltage of a VCO is determined based on whether or not falling within a given threshold value, the influence of a gap causes the control voltage of the VCO to deviate out of the threshold value. Every time the control voltage of this VCO deviates, a counter for generating a filter switching signal is reset, and it is difficult to output a timing for switching a filter.

In one aspect, an object of the present technology is to be able to perform high-speed entrainment at the time of activation even if an input signal includes an irregular gap of no signal and to be able to suppress a phase variation after switching filter coefficients at the time of being steady.

First Embodiment

Figure 1:
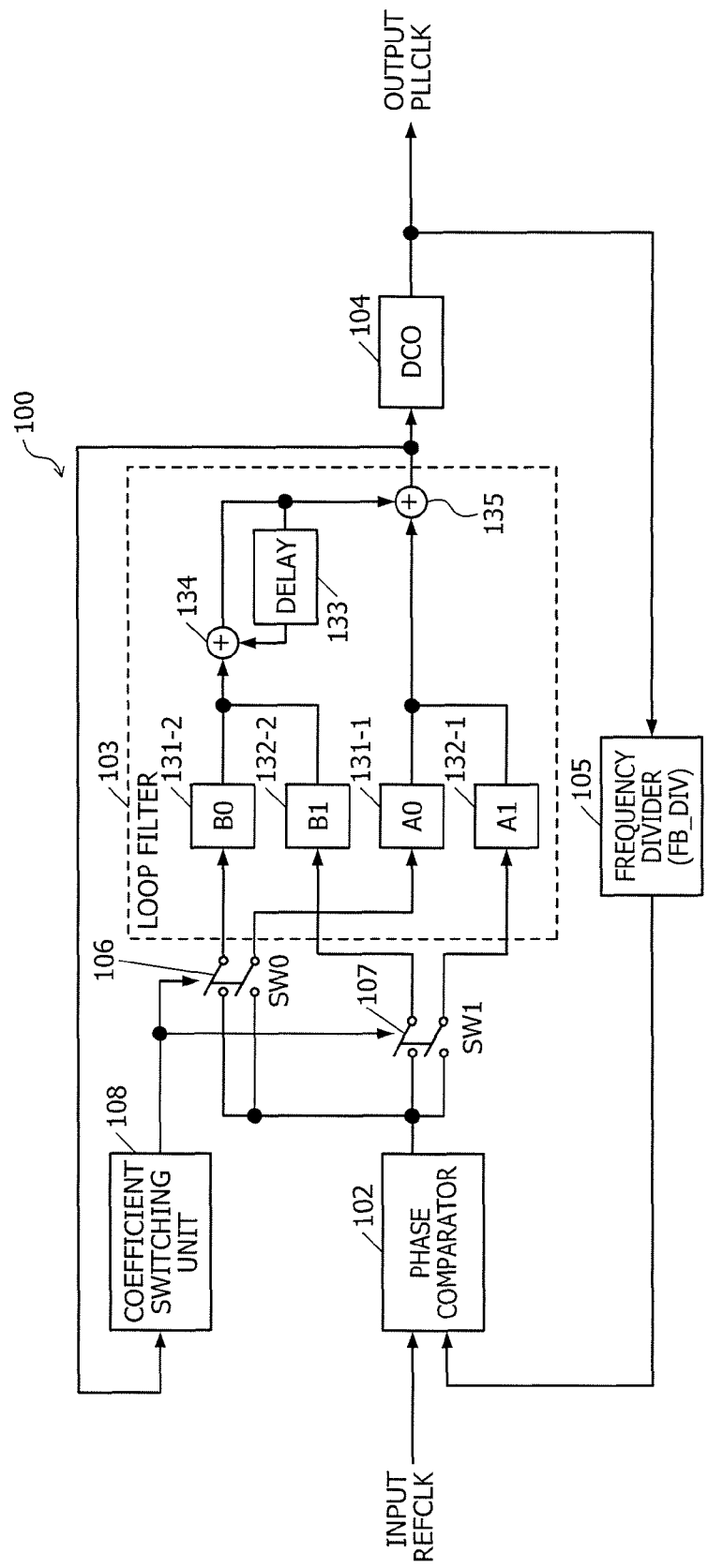
FIG. 1 is a diagram illustrating an example of a configuration of a PLL circuit according to a first embodiment.

FIG. 1 is a diagram illustrating an example of a configuration of a PLL circuit according to a first embodiment. A PLL circuit 100 illustrated in FIG. 1 includes a phase comparator 102, a loop filter 103, a digital control oscillator (DCO) 104, a frequency divider 105, a switch 106, a switch 107, and a coefficient switching unit 108.

The phase comparator 102 receives inputting of an input signal generated by an oscillator (not illustrated) located on an upstream side of the PLL circuit 100. The phase comparator 102 receives, from the DCO 104 via the frequency divider 105, inputting of an output signal generated by the DCO 104. By comparing a phase of the input signal and a phase of the output signal with each other, the phase comparator 102 generates a differential signal indicating a phase difference between the input signal and the output signal. In addition, the phase comparator 102 outputs the generated differential signal to the switch 106 and switch 107.

The loop filter 103 receives inputting of the differential signal from one on-state switch out of the switch 106 and the switch 107. The loop filter 103 cuts off, from the differential signal, noise components each having a frequency greater than or equal to a cutoff frequency corresponding to switchable filter coefficients (loop filter fixed factors). Specifically, the loop filter 103 includes multipliers 131-1 and 131-2, multipliers 132-1 and 132-2, a delay element 133, an adder 134, and an adder 135.

The multipliers 131-1 and 131-2 each receive inputting of the differential signal from the switch 106 in a case where the switch 106 is in an on-state. The multipliers 131-1 and 131-2 each multiply the differential signal by a high cutoff coefficient serving as a filter coefficient for setting a high cutoff frequency (high-speed loop characteristic) that is relatively high. Specifically, the multiplier 131-1 multiplies the differential signal by a proportionality coefficient A0 serving as a high cutoff coefficient, and the multiplier 131-2 multiplies the differential signal by an integration coefficient B0 serving as a high cutoff coefficient. In addition, the multiplier 131-1 outputs, to the adder 135, the differential signal multiplied by the corresponding high cutoff coefficient, and the multiplier 131-2 outputs, to the adder 134, the differential signal multiplied by the corresponding high cutoff coefficient. Note that each of the high cutoff coefficients is an example of a first filter coefficient.

The multipliers 132-1 and 132-2 each receive inputting of the differential signal from the switch 107 in a case where the switch 107 is in an on-state. The multipliers 132-1 and 132-2 each multiply the differential signal by a low cutoff coefficient serving as a filter coefficient for setting a low cutoff frequency (low-speed loop characteristic) that is lower than the high cutoff frequency and that is set at the time of being steady. Specifically, the multiplier 132-1 multiplies the differential signal by a proportionality coefficient A1 serving as a low cutoff coefficient, and the multiplier 132-2 multiplies the differential signal by an integration coefficient B1 serving as a low cutoff coefficient. In addition, the multiplier 132-1 outputs, to the adder 135, the differential signal multiplied by the corresponding low cutoff coefficient, and the multiplier 132-2 outputs, to the adder 134, the differential signal multiplied by the corresponding low cutoff coefficient. Note that each of the low cutoff coefficients is an example of a second filter coefficient for cutting off components each having a frequency greater than or equal to another cutoff frequency lower than a cutoff frequency corresponding to the first filter coefficient.

The delay element 133 receives, from the adder 134, inputting of the differential signal multiplied by the corresponding high cutoff coefficient or the corresponding low cutoff coefficient. The delay element 133 delays the differential signal multiplied by the corresponding high cutoff coefficient or the corresponding low cutoff coefficient and outputs, to the adder 134, a delayed signal serving as the delayed differential signal.

The adder 134 receives, from the delay element 133, inputting of the delayed signal. The adder 134 receives, from the multiplier 131-2 or the multiplier 132-2, inputting of the differential signal multiplied by the corresponding high cutoff coefficient or the corresponding low cutoff coefficient. By adding the delayed signal and the differential signal to each other, the adder 134 integrates the delayed signal. The adder 134 outputs the integrated delayed signal to the adder 135 and the delay element 133.

The adder 135 receives, from the multiplier 131-1 or the multiplier 132-1, inputting of the differential signal multiplied by the corresponding high cutoff coefficient or the corresponding low cutoff coefficient. The adder 135 receives, from the adder 134, inputting of the delayed signal. By adding the delayed signal and the differential signal to each other, the adder 135 generates the differential signal from which noise components are cut off. The adder 135 outputs, to the DCO 104, the generated differential signal as a control signal for controlling an output frequency.

The DCO 104 receives inputting of the control signal from the adder 135. The DCO 104 oscillates a frequency (hereinafter, called an "output frequency") to follow up the value of the control signal and generates an output signal having the output frequency. If the value of the control signal is TW and the pit width of the control signal is m, and the frequency of an internal clock for driving the DCO 104 is Fsys, the output frequency Fo [Hz] is expressed by the following Expression (1). In addition, the DCO 104 outputs the generated output signal to other devices and so forth, which perform various kinds of processing by using the output frequency of the output signal. In addition, the DCO 104 outputs the generated output signal to the frequency divider 105. Note that the DCO 104 is an example of an output signal oscillator.

$$Fo=(TW/2^m)\cdot Fsys \quad (1)$$

The frequency divider 105 receives inputting of the output signal from the DCO 104. The frequency divider 105 frequency-divides the output signal by a ratio of 1/an integral number and outputs the frequency-divided output signal to the phase comparator 102. If the integer number used for frequency-dividing is N and the output frequency of the output signal output by the DCO 104 is Fo, the output frequency Fdiv [Hz] of the output signal output by the frequency divider 105 is expressed by the following Expression (2).

$$Fdiv=Fo/N \quad (2)$$

The switch (SW0) 106 receives inputting of the differential signal from the phase comparator 102. The on-state or off-state of the switch 106 is set by the coefficient switching unit 108. In a case where the switch 107 (SW1) is in an on-state, the switch 106 is set to an off-state, and in a case where the switch 107 is in an off-state, the switch 106 is set to the on-state. In a case of being in the on-state, the switch 106 outputs the differential signal to the multipliers 131-1 and 131-2 in the loop filter 103.

The switch 107 receives inputting of the differential signal from the phase comparator 102. The on-state or off-state of the switch 107 is set by the coefficient switching unit 108. In a case where the switch 106 is in the on-state, the switch 107 is set to the off-state, and in a case where the switch 106 is in the off-state, the switch 107 is set to the on-state. In a case of being in the on-state, the switch 107 outputs the differential signal to the multipliers 132-1 and 132-2 in the loop filter 103.

Figure 2:
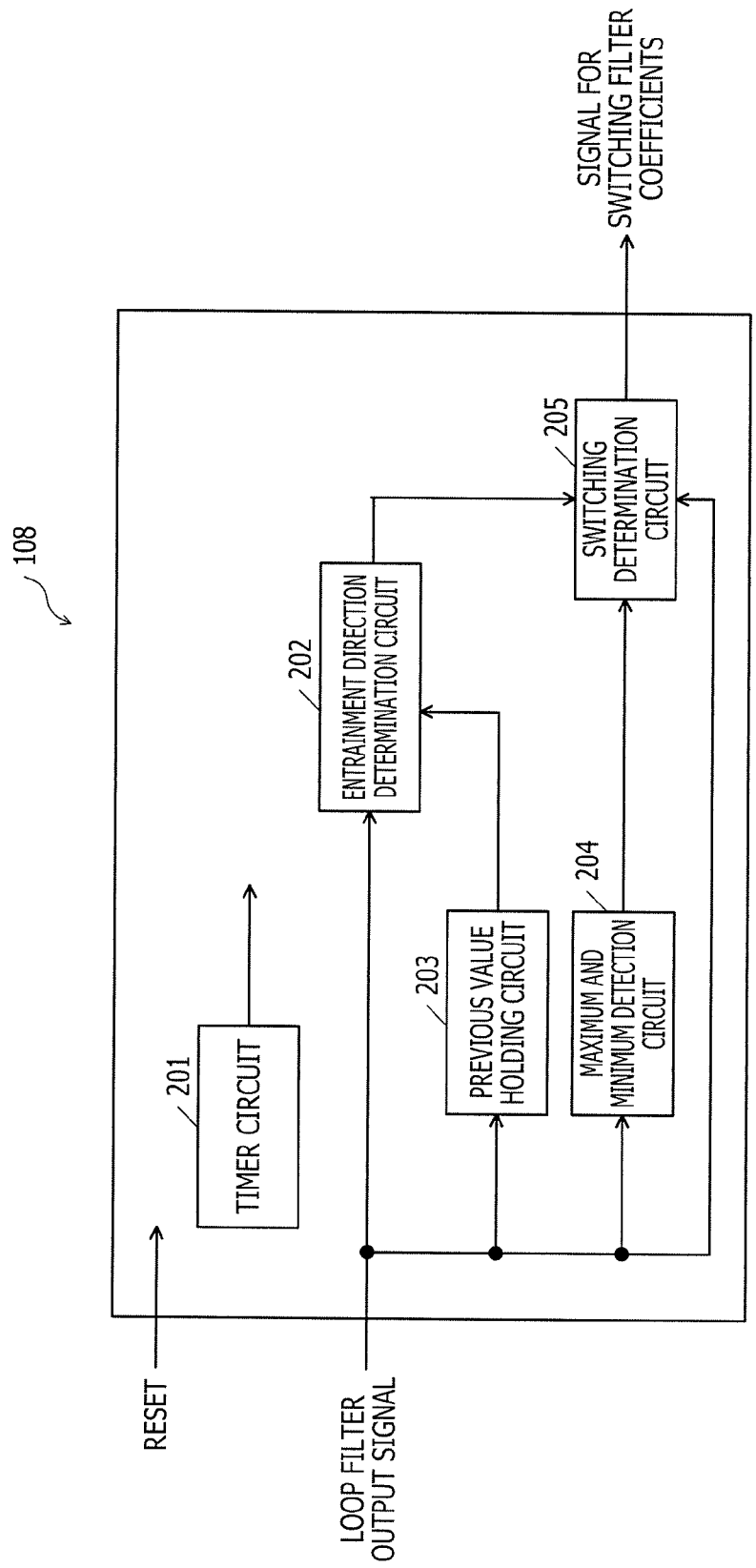
FIG. 2 is a diagram illustrating an internal configuration of a coefficient switching unit in the PLL circuit according to the first embodiment.

FIG. 2 is a diagram illustrating an internal configuration of a coefficient switching unit in the PLL circuit according to the first embodiment. The coefficient switching unit 108 switches between filter coefficients of the loop filter 103 and includes a timer circuit 201, a entrainment direction determination circuit 202, a previous value holding circuit 203, a maximum and minimum detection circuit 204, and a switching determination circuit 205.

This coefficient switching unit 108 has a function of detecting an occurrence timing of an instantaneous phase jump based on an irregular gap included in the input signal and switches the filter coefficients from high-speed loop characteristics to low-speed loop characteristics at the time of being steady, at the timing of occurrence of no gap (occurrence of no phase jump).

As described later, the switches 106 and 107, the coefficient switching unit 108, and the individual configurations in the loop filter 103, illustrated in FIG. 1, are not limited to hardware circuits and may be configured by software (firmware). In this case, each of the timer circuit 201, the entrainment direction determination circuit 202, the previous value holding circuit 203, the maximum and minimum detection circuit 204, and the switching determination circuit 205 included in the coefficient switching unit 108, illustrated in FIG. 2, is not hardware (a circuit) and functions as one of functional units of software.

At the time of activation or the like of the PLL circuit 100, the timer circuit 201 counts the elapse of a given period of time after the filter coefficients are set to high-speed loop characteristics. The entrainment direction determination circuit 202 determines a convergence direction of a frequency of a PLL output signal in a entrainment process (convergence process) of phase locking. The previous value holding circuit 203 holds a previous value of the output signal of the loop filter 103. The maximum and minimum detection circuit 204 measures the maximum value and minimum value of the loop filter output. Based on the loop filter output signal and the output signals of the entrainment direction determination circuit 202 and the maximum and minimum detection circuit 204, the switching determination circuit 205 outputs a signal for switching the filter coefficients.

(1) This coefficient switching unit 108 controls the switches 106 and 107 that are used for switching the coefficients of the loop filter 103 and that switch between an increase in speed (at the time of activation) of the loop characteristic and a decrease in speed (at the time of being steady) thereof.

(2) In a transition period in which the PLL circuit 100 is not locked with an input, such as at the time of activation or the like of the PLL circuit 100, the coefficient switching unit 108 turns on the switch (SW0) 106 in the loop filter 103 and turns off the switch (SW1) 107 therein. From this, the filter coefficients are put into high-speed loop characteristics.

(3) After the elapse of a given period of time (for example, 20 ms) in a state of the high-speed loop characteristics, the coefficient switching unit 108 initiates recording of the maximum value and the minimum value of the output value of the loop filter 103.

(4) In a given period of time (for example, 3 ms), the coefficient switching unit 108 calculates filter switching threshold values from the maximum value and the minimum value after recording the maximum value and the minimum value.

(5) If the current output value of the loop filter 103 falls within the loop filter switching threshold values, the coefficient switching unit 108 turns on the switch (SW1) 107 in the loop filter 103. From this, the filter coefficients are put into the low-speed loop characteristics at the time of being steady.

(6) If the current output of the loop filter 103 deviates out of the loop filter switching threshold values, the coefficient switching unit 108 operates without change while not switching between the switches in the loop filter 103 and repeats the operation in (5) again.

Figure 3:
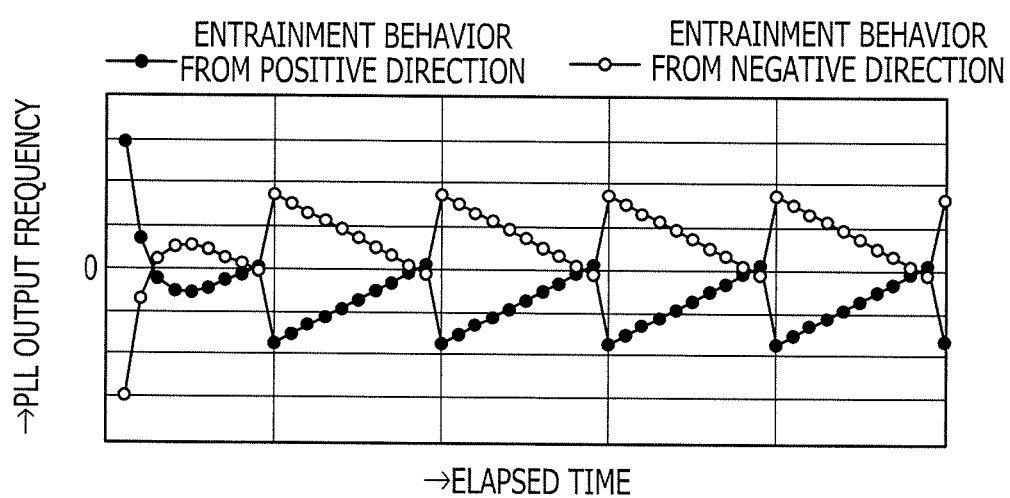
FIG. 3 is a graphic chart illustrating an output frequency of each of entrainment directions of the PLL circuit in a case where gaps are included in an input signal.

FIG. 3 is a graphic chart illustrating an output frequency of each of entrainment directions of the PLL circuit in a case where gaps are included in an input signal. In this FIG. 3, a case where gaps are included in the signal input to the PLL circuit 100 is illustrated. In FIG. 3, a horizontal axis is an elapsed time, a vertical axis therein is a PLL output frequency, a ● symbol indicates an operation at the time of entrainment from a positive direction, and a ○ symbol indicates an operation at the time of entrainment from a negative direction. "●" and "○" are outputs of the loop filter and are values of respective timings, held, as previous values, by the previous value holding circuit 203.

As illustrated in FIG. 3, in a case where gaps are included in the signal input to the PLL circuit 100, in each of the entrainment from the positive direction and the entrainment from the negative direction, convergence is repeated more than once after a frequency variation moves away from "0" (ppm) at the center. In FIG. 3, TG is a gap interval (an interval in which a deviation occurs based on a gap), and TNG is an interval other than the gap interval. Based on the state of a frequency variation illustrated in FIG. 3, the entrainment direction determination circuit 202 determines a entrainment direction (details of the determination will be described later).

Figure 4:
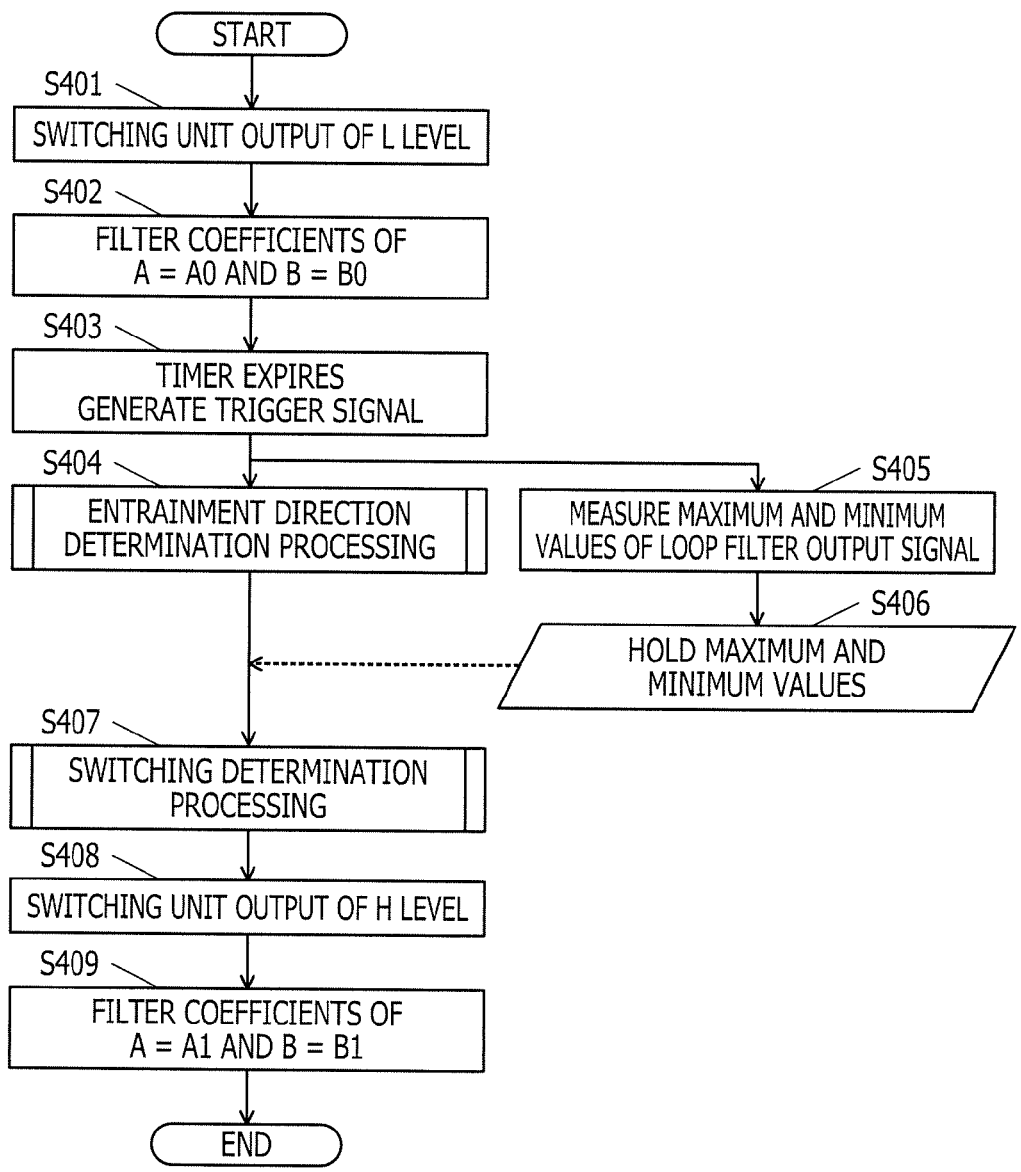
FIG. 4 is a flowchart illustrating contents of processing performed by the coefficient switching unit in the PLL circuit according to the first embodiment.

FIG. 4 is a flowchart illustrating contents of processing performed by the coefficient switching unit in the PLL circuit according to the first embodiment. Examples of processing operations in respective units included in the coefficient switching unit 108 will be described. The coefficient switching unit 108 initiates an operation, based on a reset input at the time of activation or the like of the PLL circuit 100. In addition, after initiating the operation, the coefficient switching unit 108 outputs, based on the switching determination circuit 205, "0" (a low (L) level) (step S401). From this, in FIG. 1, the switch (SW0) 106 is turned on, and the switch (SW1) 107 is turned off. Accordingly, in the loop filter 103, filter coefficients of A=A0 and B=B0 serving as high-speed loop characteristics are set (step S402).

Simultaneously with the processing operation in step S402, the timer circuit 201 starts counting a timer and counts an elapsed time period of being put into a high-speed loop. If the elapse of a given period of time (for example, 20 ms) is counted based on counting the timer, the timer expires, and the timer circuit 201 generates a trigger signal (step S403).

Based on the trigger of the timer circuit 201, the entrainment direction determination circuit 202 determines the entrainment direction illustrated in FIG. 3 (step S404). In addition, based on the trigger of the timer circuit 201, the maximum and minimum detection circuit 204 initiates measuring the maximum value and the minimum value of the output signal of the loop filter 103 (step S405) and holds, in a memory within the maximum and minimum detection circuit 204, not illustrated, the measured maximum value and minimum value of the output signal of the loop filter 103 so that the maximum value and minimum value of the output signal of the loop filter 103 is updatable (step S406). The coefficient switching unit 108 concurrently processes step S404 and step S405.

In addition, based on information of the entrainment direction due to the entrainment direction determination circuit 202 and information of the maximum value and the minimum value due to the maximum and minimum detection circuit 204, the switching determination circuit 205 performs switching determination processing for the filter coefficients (the switches (SW0 and SW1) 106 and 107) (step S407). A timing of putting the output of the coefficient switching unit 108 into "1" (a high (H) level) is obtained based on the switching determination processing in step S407 (step S408), and the coefficient switching unit 108 outputs "1" (the H level) at this obtained timing (step S409) and terminates the processing. At this time, in FIG. 1, the switch (SW0) 106 is turned off, and the switch (SW1) 107 is turned on. Accordingly, in the loop filter 103, filter coefficients of A=A1 and B=B1 serving as low-speed loop characteristics are set.

Figure 5:
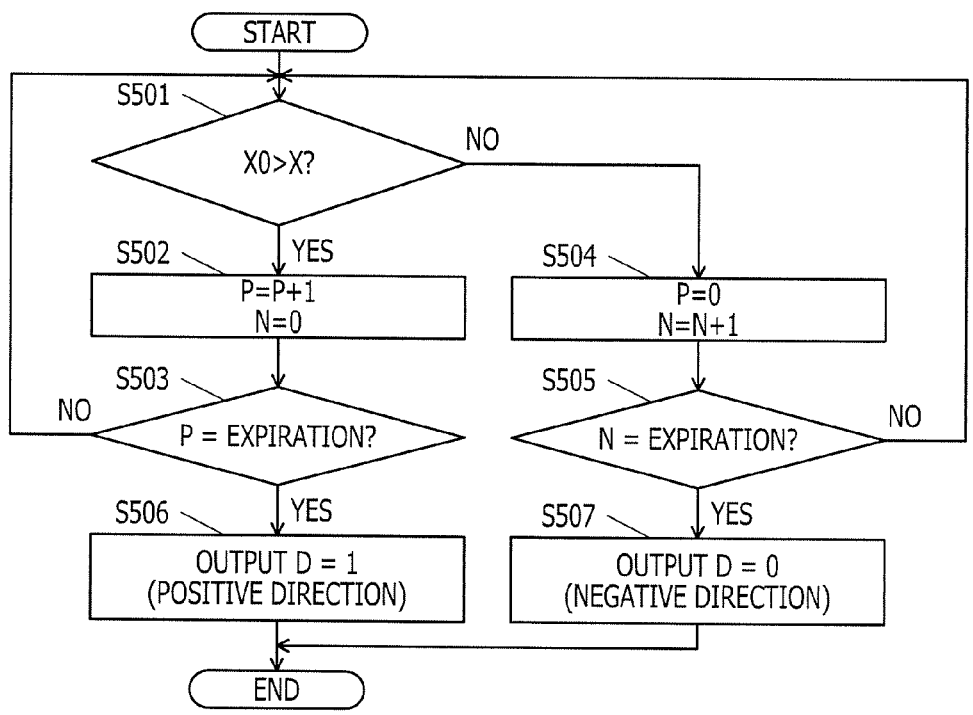
FIG. 5 is a flowchart illustrating contents of processing for entrainment direction determination, performed by the coefficient switching unit in the PLL circuit according to the first embodiment.

FIG. 5 is a flowchart illustrating contents of processing for entrainment direction determination, performed by the coefficient switching unit in the PLL circuit according to the first embodiment. An example of the processing operation in step S404 in FIG. 4, performed by the entrainment direction determination circuit 202, will be described.

First, the entrainment direction determination circuit 202 compares a current value X of the output signal of the loop filter 103 and an output signal value X0 of the loop filter 103 immediately before being output by the previous value holding circuit 203 with each other (step S501). If X0>X is satisfied, as a comparison result (step S501: Yes), the entrainment direction determination circuit 202 counts while defining as the entrainment from the positive direction (step S502). In addition, if X0>X is not satisfied, as a comparison result (step S501: No), the entrainment direction determination circuit 202 counts while defining as the entrainment from the negative direction (step S504).

It is assumed that entrainment count from the positive direction is P and entrainment count from the negative direction is N. In the entrainment from the positive direction (step S502), P is counted up. In addition, in the entrainment from the negative direction (step S504), N is counted up. At the time of this counting up, one of the two is zero-cleared. At the time of counting up P in step S502, N is simultaneously zero-cleared. At the time of counting up N in step S504, p is simultaneously zero-cleared.

In the above-mentioned determination in step S501 is implemented more than once, and it is determined whether the count value P or N expires (for example, 3 times) (step S503 or step S505). In step S503, it is determined whether P expires, and in a case where P expires (step S503: Yes), the entrainment direction determination circuit 202 outputs, as an output (D value), a determination result, "1", (the positive direction) (step S506) and terminates the processing. If P does not expire in step S503 (step S503: No), the processing is returned to step S501.

In step S505, it is determined whether N expires, and in a case where N expires (step S505: Yes), the entrainment direction determination circuit 202 outputs, as an output (D value) of a determination result of the entrainment direction, a determination result, "0", (the negative direction) (step S507) and terminates the processing. If N does not expire in step S505 (step S505: No), the processing is returned to step S501.

Figure 6:
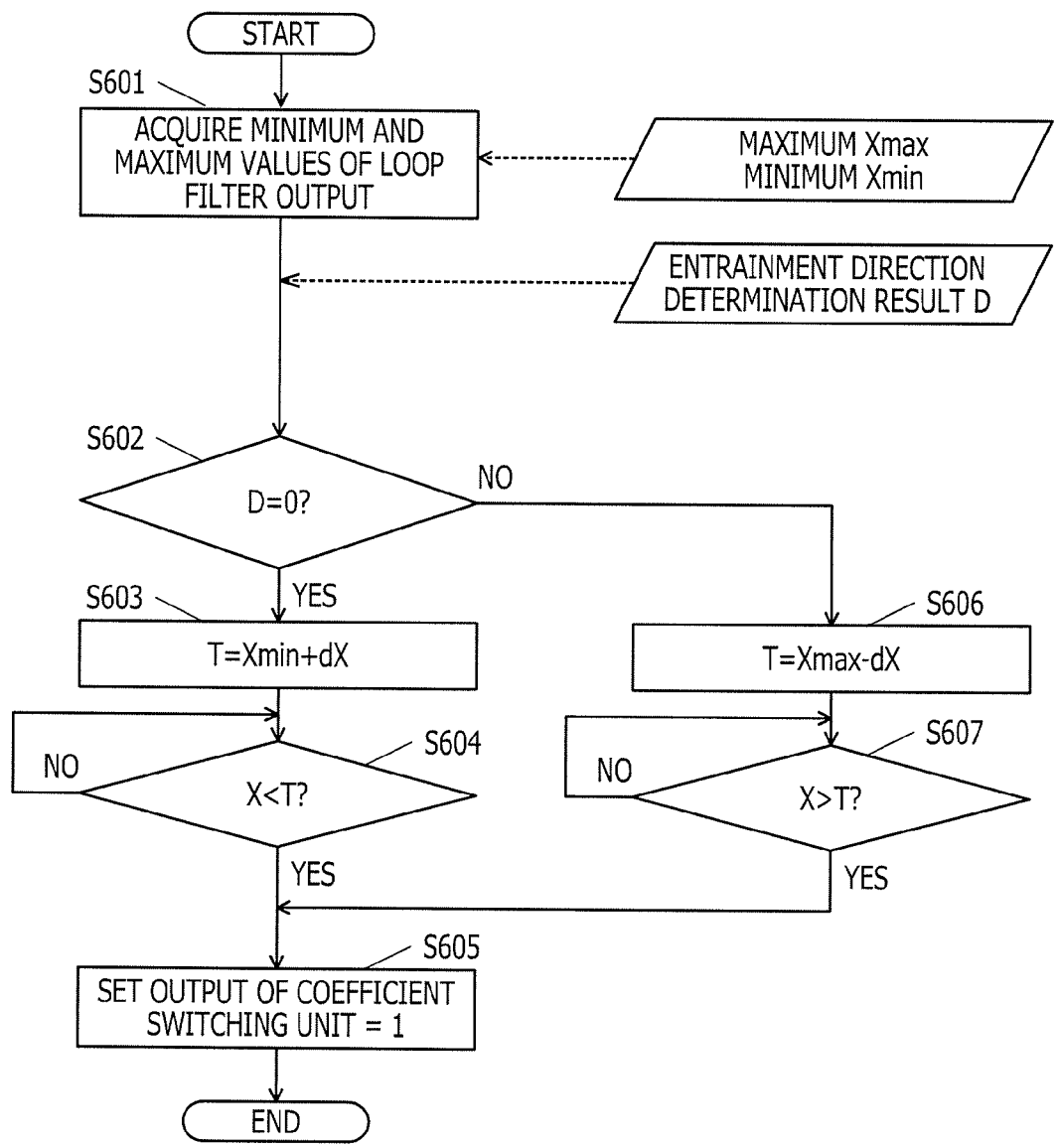
FIG. 6 is a flowchart illustrating contents of processing for switching determination, performed by the coefficient switching unit in the PLL circuit according to the first embodiment.

FIG. 6 is a flowchart illustrating contents of processing for switching determination, performed by the coefficient switching unit in the PLL circuit according to the first embodiment. An example of the processing operation in step S407 in FIG. 4, performed by the switching determination circuit 205, will be described.

First, in a given period of time (for example, 3 ms), the switching determination circuit 205 acquires the maximum value and the minimum value of the output of the loop filter 103 from the output of the maximum and minimum detection circuit 204 (step S601) and holds and updates the maximum value and the minimum value. In addition, the switching determination circuit 205 acquires the output D of the determination result of the entrainment direction determination circuit 202 and determines whether D is "0" (step S602).

If the output D of the determination result is "0" (the entrainment from the negative direction) (step S602: Yes), a threshold value T obtained by adding an acceptable value dX to the minimum value Xmin of the output of the loop filter 103 is set (step S603). In addition, the switching determination circuit 205 determines whether the current output value X of the loop filter 103 is smaller than the threshold value T (step S604). If the current output value X of the loop filter 103 is smaller than the threshold value T (X<T and step S604: Yes), a timing when the filter coefficients are able to be switched is determined, and "1" is set as the output of the coefficient switching unit 108 (step S605). On the other hand, if the current output value X of the loop filter 103 is greater than or equal to the threshold value T (X≥T and step S604: No), the processing waits for the output value X to become smaller than the threshold value T (a loop of step S604: No).

On the other hand, if the output D of the determination result is "1" (the entrainment from the positive direction) (step S602: No), a threshold value T obtained by subtracting the acceptable value dX from the maximum value Xmax of the output of the loop filter 103 is set (step S606). In addition, the switching determination circuit 205 determines whether the current output value X of the loop filter 103 is larger than the threshold value T (step S607). If the current output value X of the loop filter 103 is larger than the threshold value T (X>T and step S607: Yes), a timing when the filter coefficients are able to be switched is determined, the processing makes a transition to step S605, the coefficient switching unit 108 sets "1" as the output thereof (step S605), and the processing is terminated. On the other hand, if the current output value X of the loop filter 103 is less than or equal to the threshold value T (X≤T and step S607: No), the processing waits for the output value X to become larger than the threshold value T (a loop of step S607: No).

Figure 7:
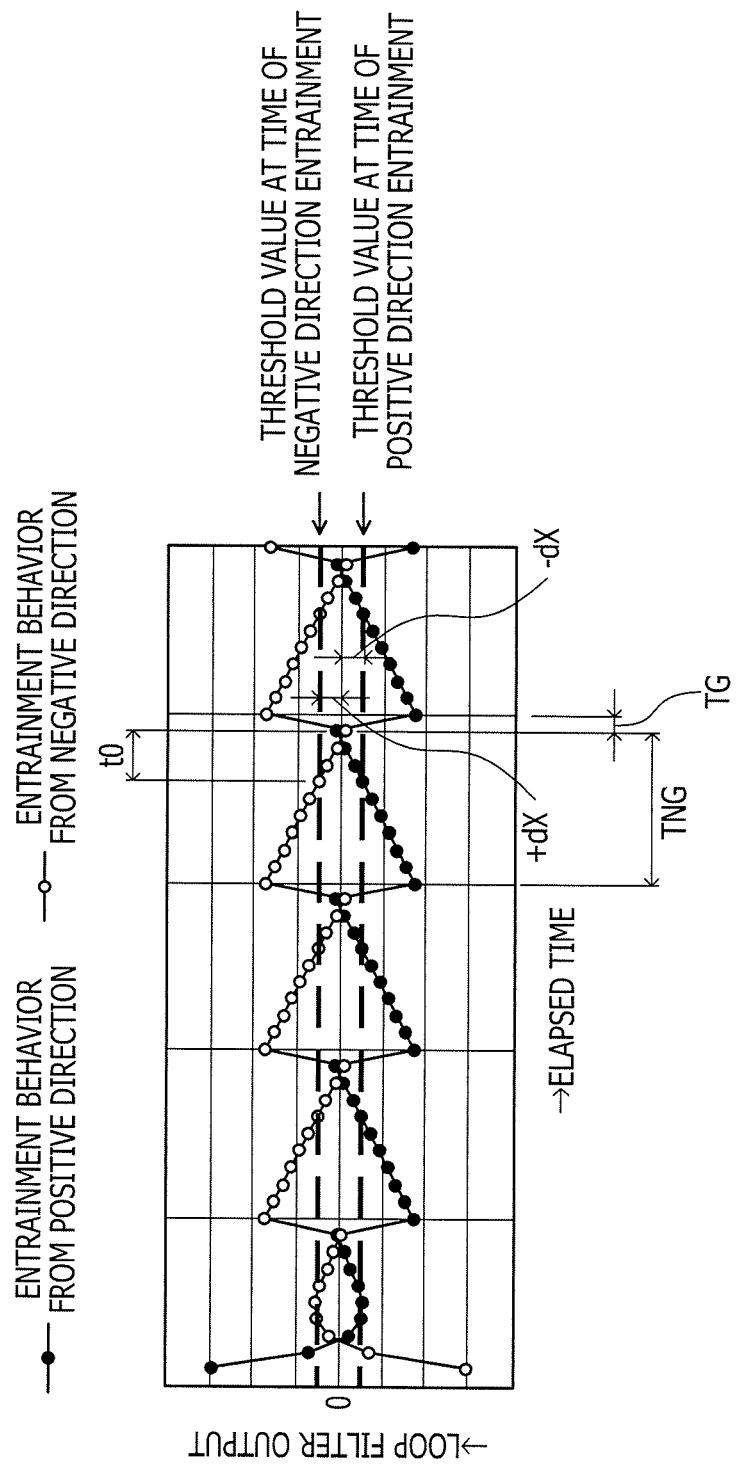
FIG. 7 is a graphic chart illustrating examples of threshold values set by the coefficient switching unit in the PLL circuit according to the first embodiment.

FIG. 7 is a graphic chart illustrating examples of threshold values set by the coefficient switching unit in the PLL circuit according to the first embodiment. Threshold values set by the switching determination circuit 205 in the coefficient switching unit 108 and the output frequency of each of entrainment directions of the PLL circuit illustrated in FIG. 3 are illustrated.

As described using FIG. 6, if the switching determination circuit 205 in the coefficient switching unit 108 outputs an output=1, the switch (SW1) 107 is turned on, and the switch (SW0) 106 is turned off. From this, filter coefficients of A=A1 and B=B1 serving as low-speed loop characteristics are set in the loop filter 103, and switching of the filter coefficients is completed.

In FIG. 7, the threshold value T for the entrainment in the negative direction is set to a value obtained by adding the amount of dX to "0" (ppm) at the center, and the threshold value T for the entrainment in the positive direction is set to a value obtained by subtracting the amount of dX from "0" (ppm). From this, at the time of the entrainment in the negative direction, the switching determination circuit 205 in the coefficient switching unit 108 switches the filter coefficients to "1" (A=A1 and B=B1) at a timing when the current output value X of the loop filter 103 is smaller than the threshold value T. On the other hand, at the time of the entrainment in the positive direction, the switching determination circuit 205 switches the filter coefficients to "1" (A=A1 and B=B1) at a timing when the current output value X of the loop filter 103 is larger than the threshold value T.

As described above, regarding the current output value X of the loop filter 103, the filter coefficients are switched to "1" (A=A1 and B=B1) of the low-speed loop characteristics at an adequate timing by using the threshold value T. This switching timing corresponds to a timing of avoiding a gap (an instantaneous phase jump) included in the input signal. In addition, after switching of the filter coefficients, it is possible to cause the frequency variation of the output signal to be converged to "0" (ppm) at the center.

By switching the filter coefficients at a timing when the frequency variation of the output signal illustrated in, for example, FIG. 7 is located between "0" (ppm) at the center and the threshold value dX, it is possible to cause to be converged thereafter, and it is possible to resolve repetition of re-convergence. In, for example, an interval of t0 in FIG. 7, the filter coefficients are switched to the low-speed loop characteristics at the time of being steady. This t0 falls within a range of the interval TNG other than the gap interval TG.

According to the first embodiment, it is possible to perform switching from a high-speed loop operation to a low-speed loop operation in a entrainment process for locking a phase with the input signal, while not being influenced by a gap included in the input signal. Based on, for example, determination of the entrainment direction and the maximum and minimum values of the loop filter output, the filter coefficients are switched at a timing when no gap is included in the input signal. From this, it is possible to avoid a phase variation of the PLL output frequency at the time of switching the filter coefficients and after the switching. In addition, it is possible to perform high-speed entrainment at the time of activation even if the input signal includes an irregular gap of no signal and to suppress a phase variation after switching the filter coefficients at the time of being steady, and it is possible to balance the high-speed entrainment and the suppression of the phase variation with each other.

In addition, regarding the determination of the entrainment direction, the magnitudes of the loop filter output value and the output previous value of the loop filter are determined more than once, and based on it that a magnitude relation is continuously the same, it is possible to correctly determine the entrainment direction. In addition, regarding the entrainment from the positive direction and the entrainment from the negative direction, by using threshold values individually corresponding thereto, a switching timing is determined based on the loop filter output value. From this, even if a entrainment state is any one of the positive direction and the negative direction, it is possible to switch the filter coefficients at an adequate switching timing.

Second Embodiment

Figure 8:
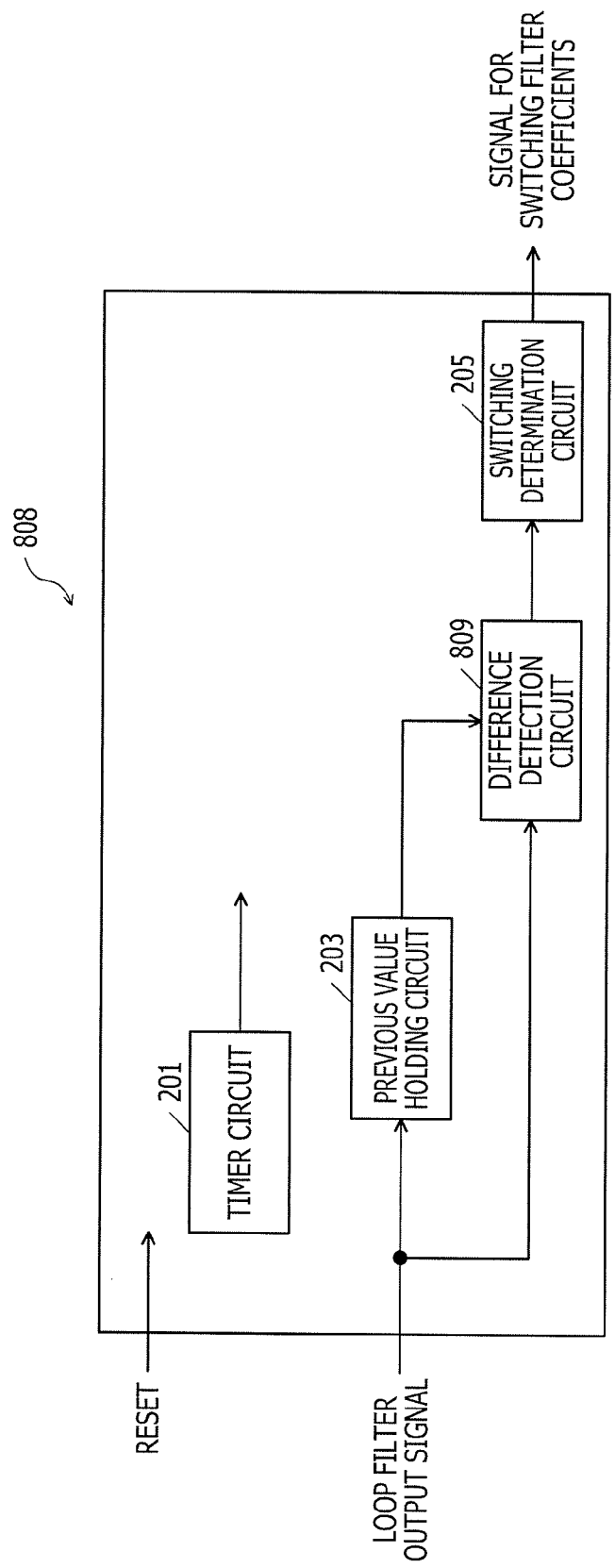
FIG. 8 is a diagram illustrating an example of a configuration of a PLL circuit according to a second embodiment.

FIG. 8 is a diagram illustrating an example of a configuration of a PLL circuit according to a second embodiment. A PLL circuit 100 in the second embodiment has the same configuration as that in the first embodiment (FIG. 1). In the second embodiment, the circuit configuration of the coefficient switching unit 108 described in the first embodiment (see FIG. 2) is simplified.

A coefficient switching unit 808 in the second embodiment includes the timer circuit 201, the previous value holding circuit 203, a difference detection circuit 809, and the switching determination circuit 205. At the time of activation or the like of the PLL circuit 100, the timer circuit 201 counts the elapse of a given period of time after the filter coefficients are set to a high-speed loop. The previous value holding circuit 203 holds a previous value of an output of the loop filter 103. The difference detection circuit 809 outputs a difference between an output of the previous value holding circuit 203 and an output of the loop filter 103. In accordance with an output of the difference detection circuit 809, the switching determination circuit 205 outputs a signal for switching the filter coefficients.

Figure 9:
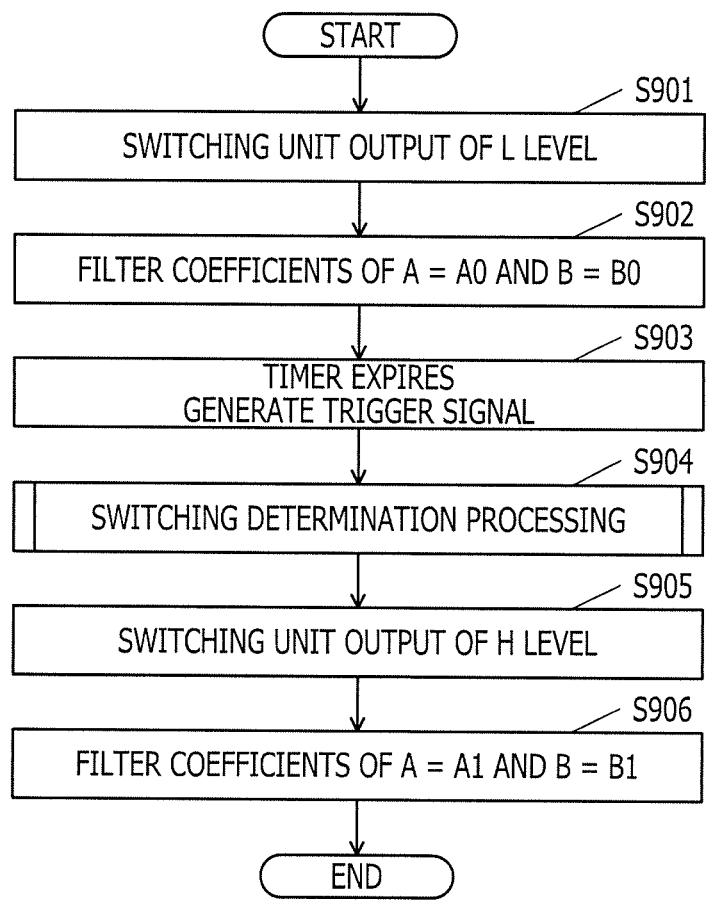
FIG. 9 is a flowchart illustrating contents of processing performed by a coefficient switching unit in the PLL circuit according to the second embodiment.

FIG. 9 is a flowchart illustrating contents of processing performed by a coefficient switching unit in the PLL circuit according to the second embodiment. The coefficient switching unit 808 initiates an operation, based on a reset input at the time of activation or the like of the PLL circuit 100. In addition, after initiating the operation, the coefficient switching unit 808 outputs, based on the switching determination circuit 205, "0" (a low (L) level) (step S901). From this, in FIG. 1, the switch (SW0) 106 is turned on, and the switch (SW1) 107 is turned off. Accordingly, in the loop filter 103, the filter coefficients of A=A0 and B=B0 serving as high-speed loop characteristics are set (step S902).

Simultaneously with the processing operation in step S902, the timer circuit 201 starts counting a timer and counts an elapsed time period of being put into a high-speed loop. If the elapse of a given period of time (for example, 20 ms) is counted based on counting the timer, the timer expires, and the timer circuit 201 generates a trigger signal (step S903).

After the timer circuit 201 generates the trigger, the difference detection circuit 809 initiates outputting a difference absolute value ΔX between a previous value X0 of the output of the loop filter 103, output by the previous value holding circuit 203, and the current output value X of the loop filter. In addition, based on the output ΔX of the difference detection circuit 809, the switching determination circuit 205 performs switching determination processing for the filter coefficients (the switches (SW0 and SW1) 106 and 107) (step S904).

A timing of putting the output of the coefficient switching unit 808 into "1" (a high (H) level) is obtained based on the switching determination processing in step S904 (step S905), and the coefficient switching unit 808 outputs "1" (the H level) at this obtained timing (step S906) and terminates the processing. At this time, in FIG. 1, the switch (SW0) 106 is turned off, and the switch (SW1) 107 is turned on. Accordingly, in the loop filter 103, filter coefficients of A=A1 and B=B1 serving as low-speed loop characteristics are set.

Figure 10:
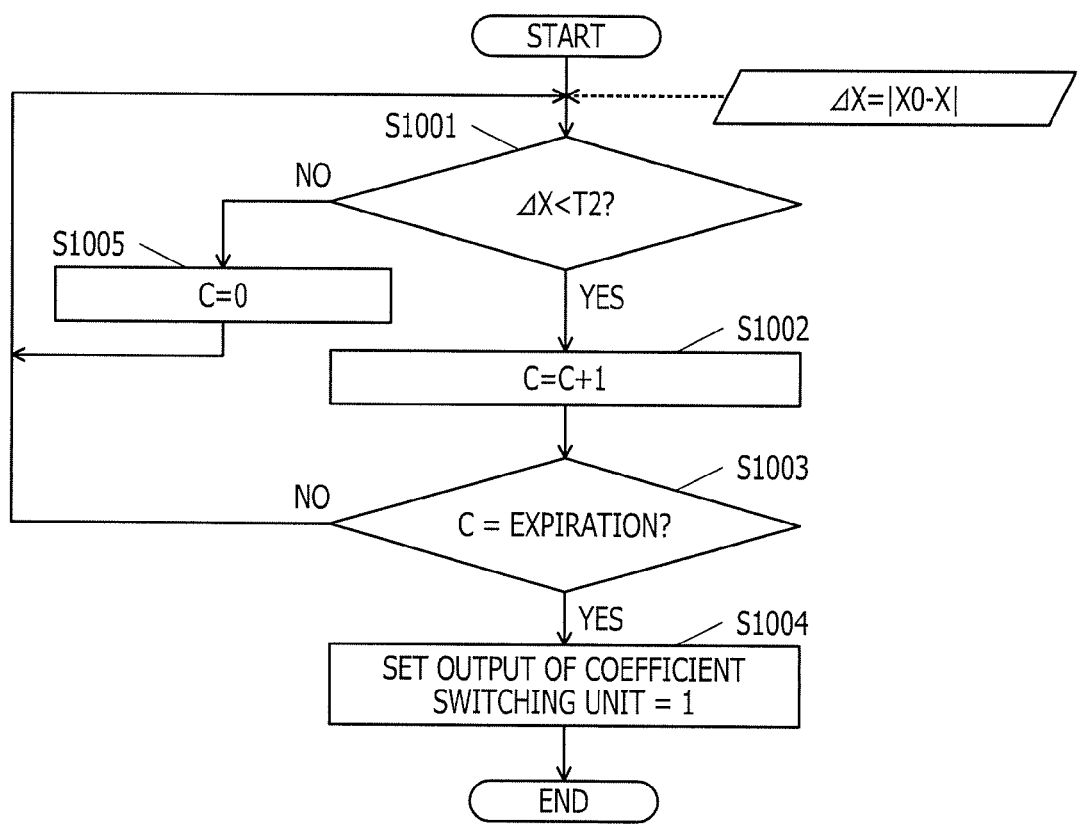
FIG. 10 is a flowchart illustrating contents of processing for switching determination, performed by the coefficient switching unit in the PLL circuit according to the second embodiment.

FIG. 10 is a flowchart illustrating contents of processing for switching determination, performed by the coefficient switching unit in the PLL circuit according to the second embodiment. An example of the processing operation in step S904 in FIG. 9, performed by the switching determination circuit 205, will be described.

First, the switching determination circuit 205 makes a comparison in order to determine whether the output ΔX from the difference detection circuit 809 is smaller than a predetermined determination value (threshold value) T2 (step S1001). The determination value T2 is set as a value sufficiently smaller than a difference generated at the timing of a gap (details thereof will be described later).

In addition, in a case where ΔX is smaller than the determination value T2 (step S1001: Yes), the switching determination circuit 205 counts up a count value C (step S1002). After that, the comparison between ΔX and the determination value T2 in step S1001 is made more than once, thereby determining that ΔX<T2 is continuously satisfied, until the count value C expires (a loop of step S1003: No).

If ΔX<T2 is continuously satisfied more than once and the count value C expires (step S1003: Yes), the output frequency of the PLL circuit 100 is in the vicinity of a convergence frequency with no gap. Therefore, the coefficient switching unit 808 sets "1" as an output (step S1004), and the processing is terminated.

If the switching determination circuit 205 in the coefficient switching unit 808 outputs an output=1, the switch (SW1) 107 is turned on, and the switch (SW0) 106 is turned off. From this, filter coefficients of A=A1 and B=B1 serving as low-speed loop characteristics are set in the loop filter 103, and switching of the filter coefficients is completed.

On the other hand, in a case where, based on the comparison between ΔX and the determination value T2, it is determined that ΔX≥T2 is satisfied (step S1001: No), the switching determination circuit 205 zero-clears the count value C (step S1005) and after that, the switching determination circuit 205 repeats the comparison processing in and after step S1001.

Figure 11:
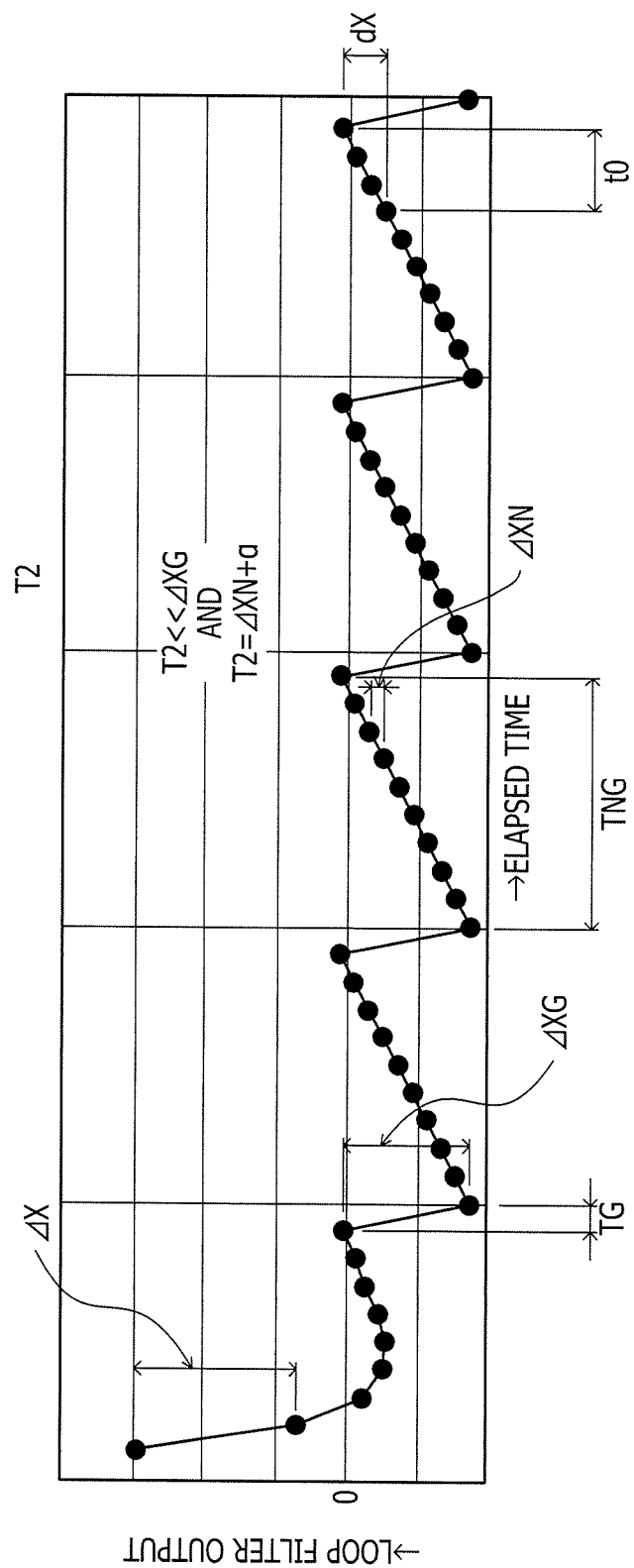
FIG. 11 is a graphic chart for explaining a setting of a determination value used by the coefficient switching unit in the PLL circuit according to the second embodiment.

FIG. 11 is a graphic chart for explaining a setting of a determination value used by the coefficient switching unit in the PLL circuit according to the second embodiment. A horizontal axis is an elapsed time, and a vertical axis is a loop filter output. FIG. 11 illustrates an output state of the loop filter 103 at the time of the entrainment from the positive direction. The determination value T2 is set to a value sufficiently smaller than a difference ΔXG between the filter output of the loop filter 103 and the previous value thereof in a gap interval. In addition, the determination value T2 is set to a value larger than a difference ΔXN in an interval other than the gap interval. In other words, the determination value T2 is set to the extent that T2<<ΔXG and T2=ΔXN+α (α: a given number), for example, T2≈2×ΔXN, are satisfied.

Based on an operation performed by the coefficient switching unit 808 of the second embodiment, switching from the high-speed loop operation to the low-speed loop operation in the entrainment process is performed while avoiding the timing of a gap included in the input signal. The switching from the high-speed loop operation to the low-speed loop operation in the entrainment process is performed at, for example, a timing within the range of the time period t0 in FIG. 11 (see FIG. 7). From this, it is possible to avoid the phase variation of the output frequency of the PLL circuit 100 at the time of switching the filter coefficients of the loop filter 103.

In addition, according to the second embodiment, it is possible to omit determination of the entrainment direction, performed by the entrainment direction determination circuit 202 and described in the first embodiment, and it is possible to simplify a circuit configuration by the amount.

Figure 12:
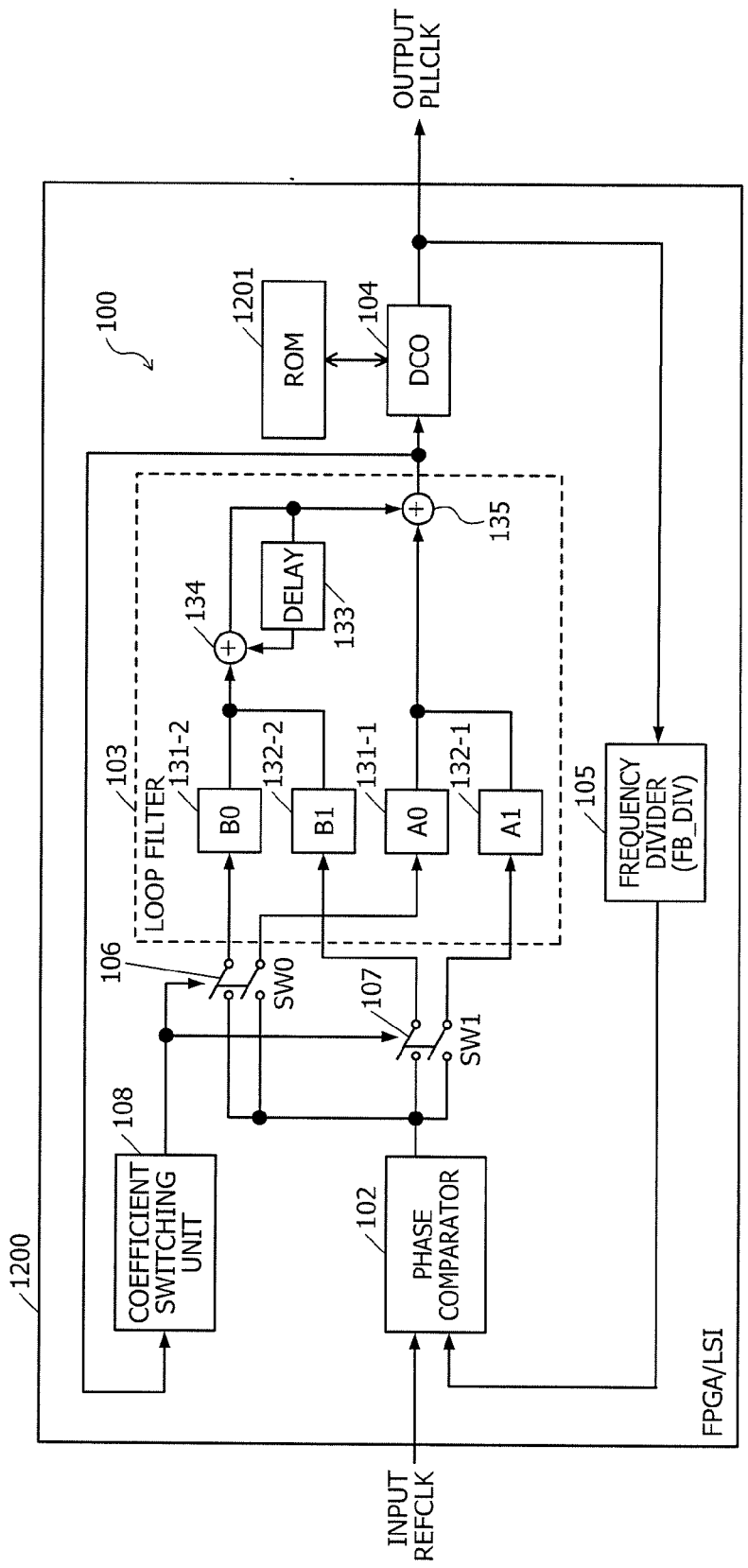
FIG. 12 is a diagram illustrating an example of a configuration of the PLL circuit of each of the embodiments (a first part)
Figure 13:
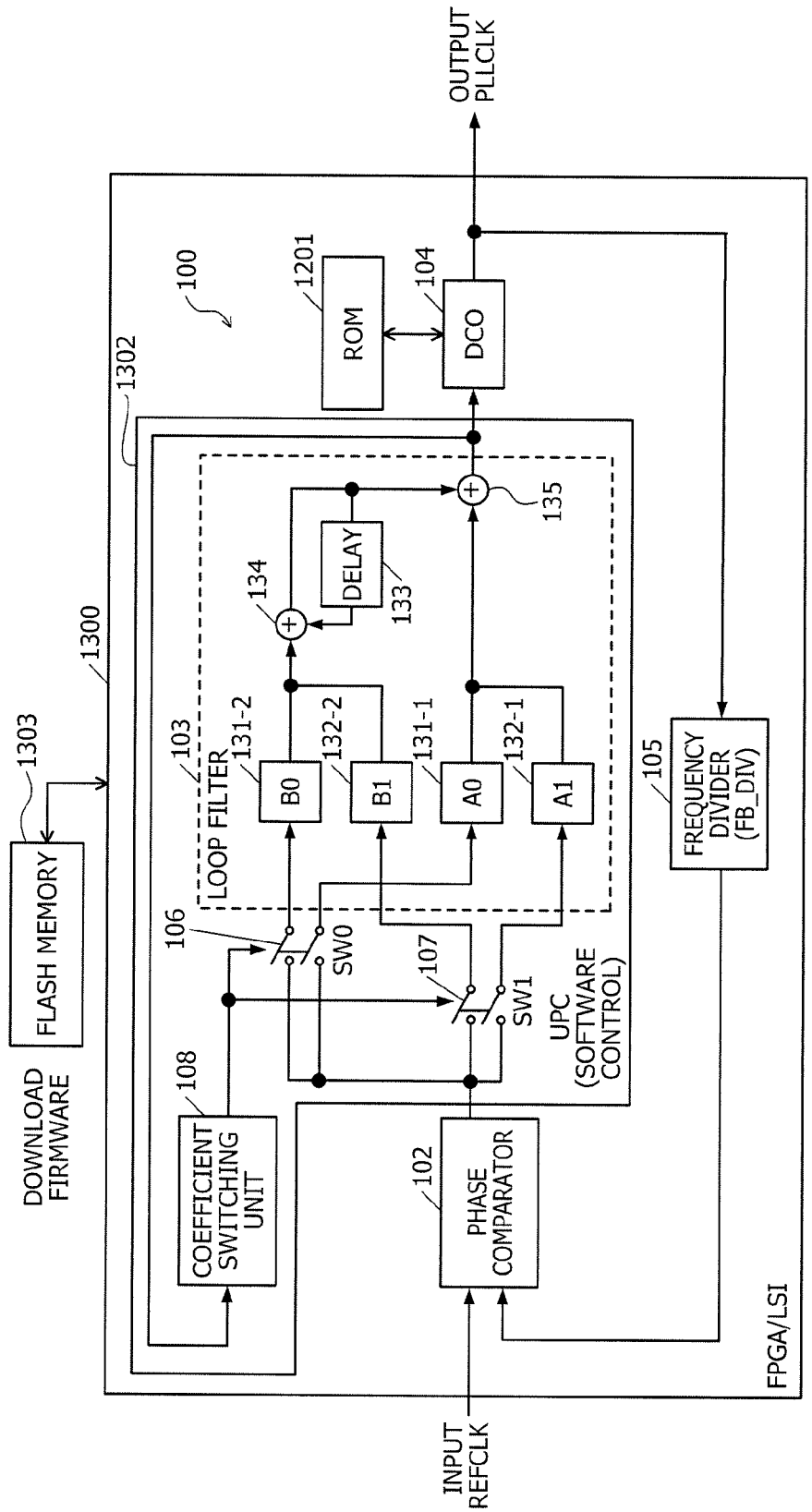
FIG. 13 is a diagram illustrating an example of a configuration of the PLL circuit of each of the embodiments (a second part)

FIG. 12 and FIG. 13 are diagrams each illustrating an example of a configurations of the PLL circuit of each of the embodiments. A PLL circuit 1200 illustrated in FIG. 12 is an example in which all the elements (circuits) of the PLL circuit 100 illustrated in FIG. 1 are configured by hardware based on devices such as a field programmable gate array (FPGA), an LSI, and a ROM. In a ROM 1201, numerical value data referenced by the DCO 104 for frequency generation is stored while being tabulated (in lookup table (LUT) form).

A PLL circuit 1300 illustrated in FIG. 13 has a configuration in which the functions of the loop filter 103 and the coefficient switching unit 108 in the PLL circuit 100 illustrated in FIG. 1 are implemented in a microprocessor 1302. The microprocessor 1302 is controlled by firmware downloaded via a flash memory 1303 and uses a programming language of, for example, Unified Parallel C (UPC). In addition, in the PLL circuit 100, function elements (circuits) other than the loop filter 103 or the coefficient switching unit 108 are configured by hardware such as a FPGA and an LSI in the same way as in FIG. 12.

Occurrence and Influence of Gap Included in Input Signal

Figure 14D:
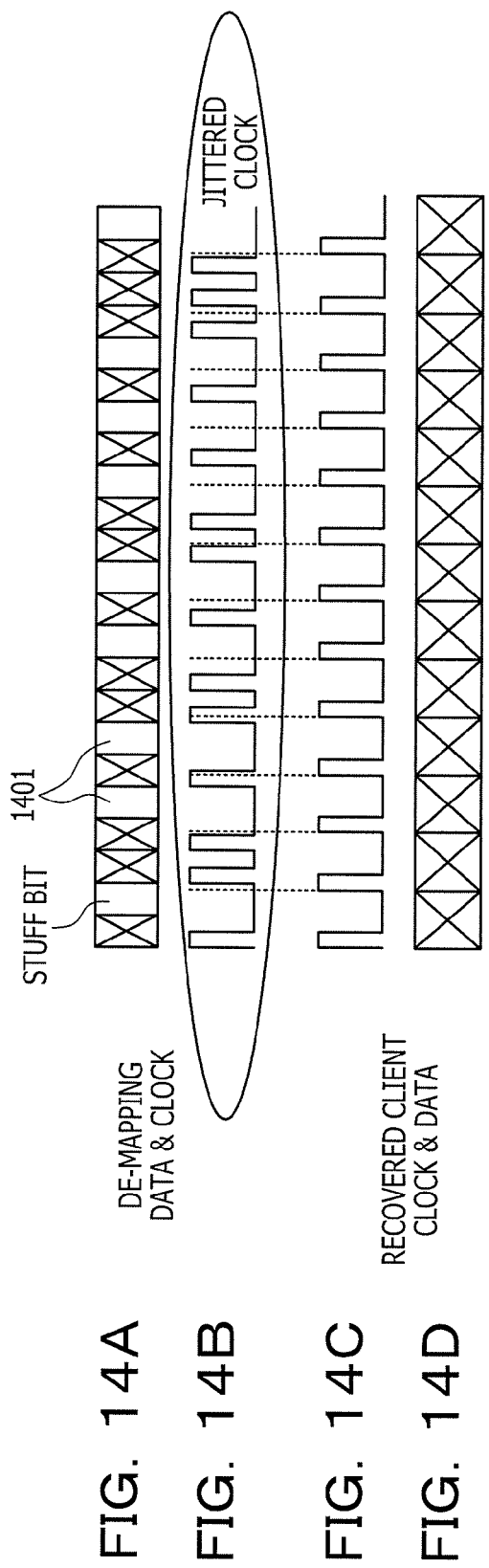

Next, occurrence and influence of the above-mentioned gap will be described. FIGS. 14A to 14D are graphic charts for explaining generation of a gapped clock. In a transmission device, data signals whose transmission rates are diversified are multiplexed and contained by using a common system clock, thereby performing transmission. As illustrated in FIG. 14A, on a transmitting side, extra data (stuff bit) 1401 for resolving a difference between rates of data signals contained at a system clock rate is inserted.

On a receiving side, in order to demodulate a reception signal into original data, the stuff bits 1401 inserted on the transmitting side are removed. A clock from which the stuff bits 1401 are removed is temporally ununiform (a jittered clock) as illustrated in FIG. 14B and is temporally uniformed by a digital PLL (DPLL) or the like as illustrated in FIG. 14C, thereby performing data demodulation in FIG. 14D.

Figure 15:
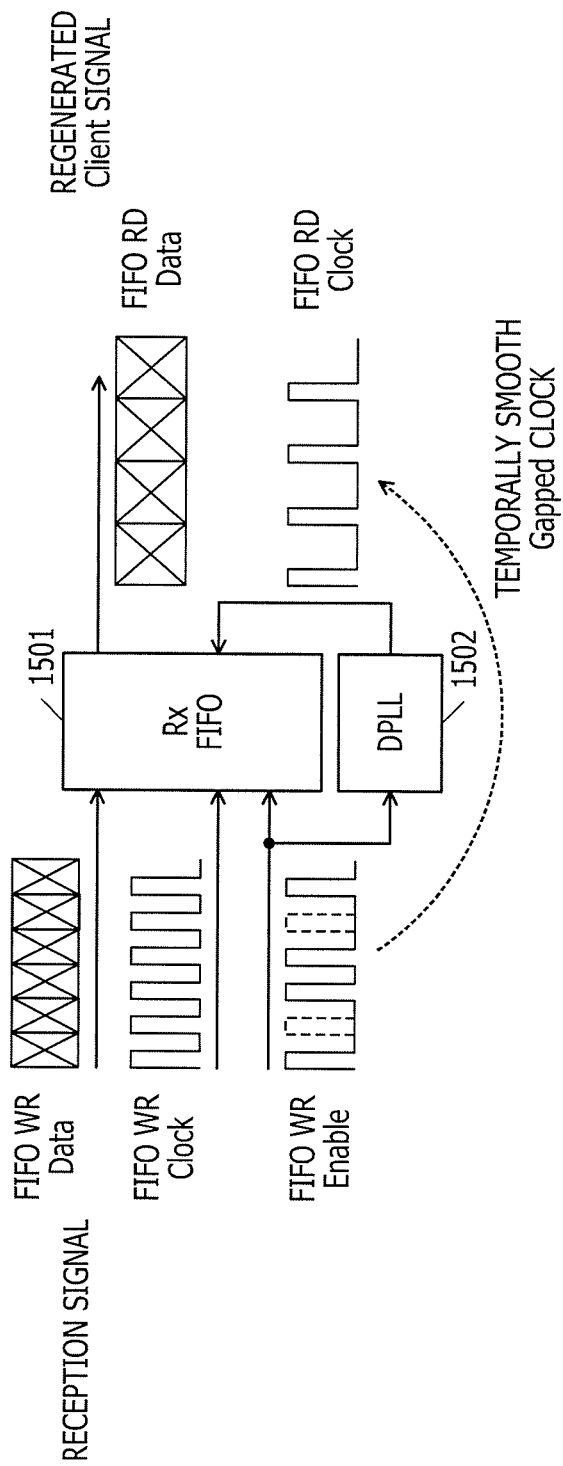
FIG. 15 is a diagram illustrating an outline of uniforming, based on a DPLL, a clock including gaps.

FIG. 15 is a diagram illustrating an outline of uniforming, based on a DPLL, a clock including gaps. Data and a clock are write (WR)-input to a Rx first in first out (FIFO) 1501 on the receiving side, and a WR enable (clock) for the Rx FIFO 1501 is temporally ununiform based on the removal of the stuff bits. A DPLL 1502 temporally uniforms and supplies the jittered clock as a read (RD) clock of the Rx FIFO 1501. From this, it is possible to temporally uniform and read a regenerated client signal (data) from the Rx FIFO 1501.

Figure 16A:
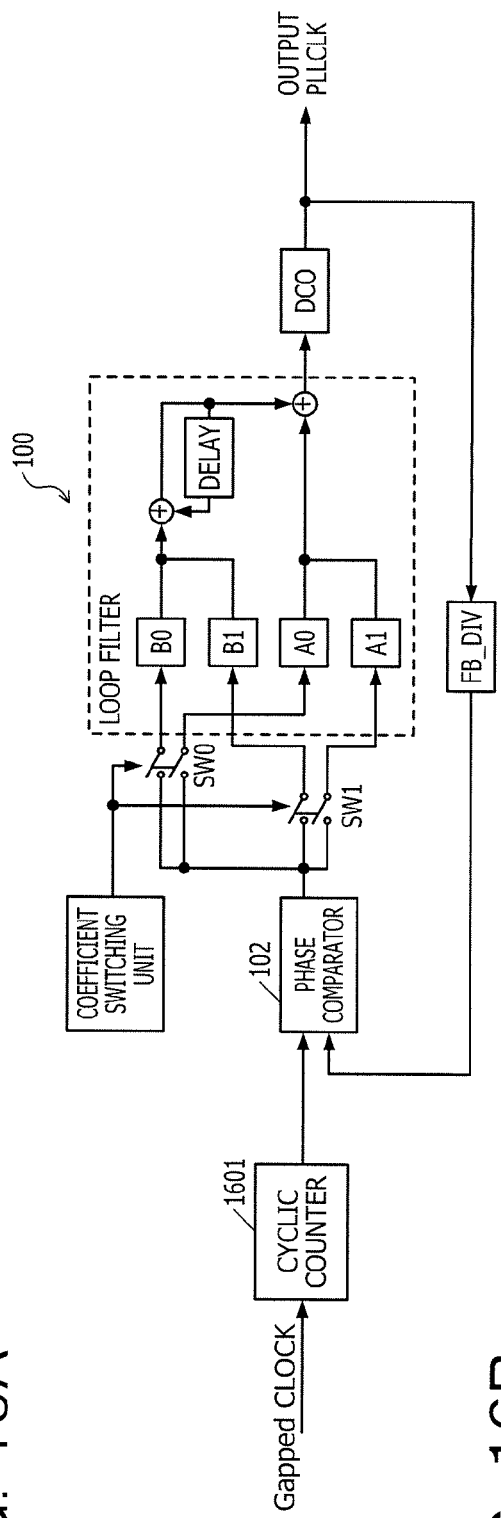
FIGS. 16A to 16C are diagrams illustrating a state of inputting, to the DPLL, an input signal including gaps.
Figure 16B:
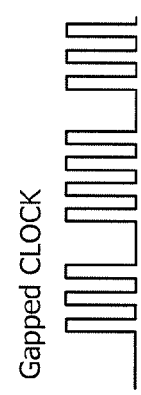
Figure 16C:
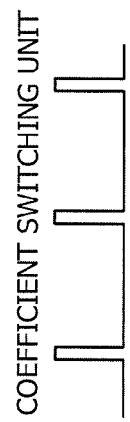

FIGS. 16A to 16C are diagrams illustrating a state of inputting, to the DPLL, an input signal including gaps. The DPLL illustrated in FIG. 16A is the PLL circuit 100 illustrated in each of the embodiments (FIG. 1 and so forth). Usually an input signal (a clock: a gapped clock) including gaps is not directly input to the phase comparator 102 in the DPLL (the PLL circuit 100) and is routed through a cyclic counter 1601.

The cyclic counter 1601 counts the number of pulses of the input signal including gaps, illustrated in FIG. 16B, and as illustrated in FIG. 16C, if the number of counts reaches a setting value N, the cyclic counter 1601 outputs 1 pulse. The cyclic counter 1601 has the same configuration as that of an N-frequency divider (the frequency divider 105).

Figure 17A:
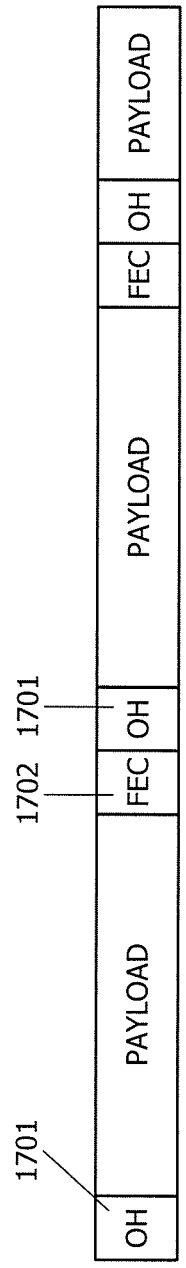
FIGS. 17A to 17C are diagrams for explaining states of phase jumps caused by gaps.
Figure 17B:
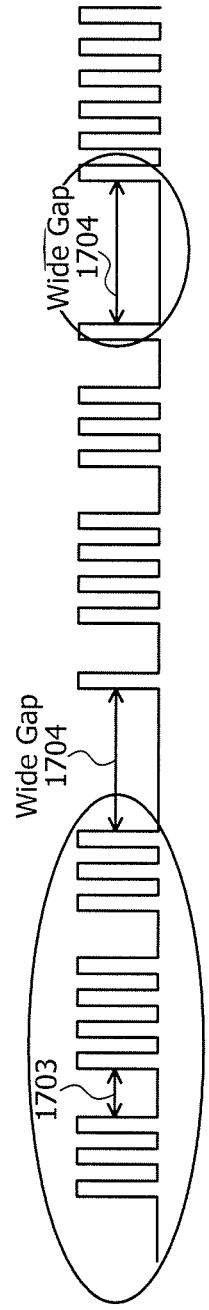
Figure 17C:
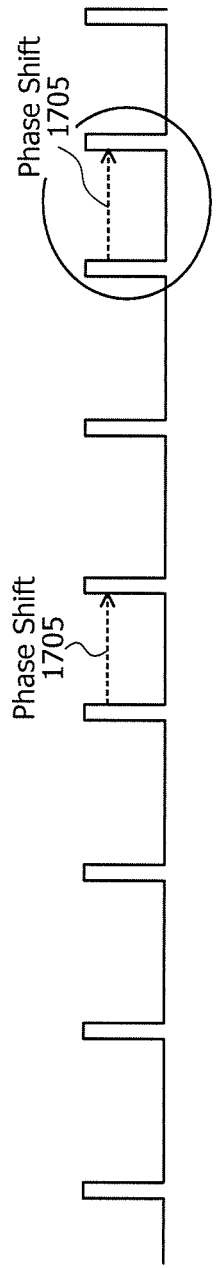

FIGS. 17A to 17C are diagrams for explaining states of phase jumps caused by gaps. FIG. 17A corresponds to reception data configuration, FIG. 17B corresponds to an input signal including gaps, and FIG. 17C corresponds to an output of the cyclic counter 1601. A gap in the input signal not only occurs in a limited way in the above-mentioned removal of stuff bits but also occurs, in the same way, in removal of bits of an overhead (OH) 1701, a forward error correction (FEC) 1702, or the like added to a data signal, as illustrated in FIG. 17A. These bits serving as removal targets are additional information of several bits and cause a large phase jump, depending on the timing of the count of the cyclic counter 1601.

As illustrated in, for example, FIG. 17B, while, in a payload portion of reception data, there is a gap interval 1703 of 1 clock at a maximum, wide gaps 1704 each exceeding 1 clock occur in the FECs 1702 and the OHs 1701. Depending on the timing of the count of the cyclic counter 1601, the wide gaps 1704 cause large phase jumps 1705 as illustrated in FIG. 17C, and an input phase for the phase comparator 102 widely varies.

Figure 18:
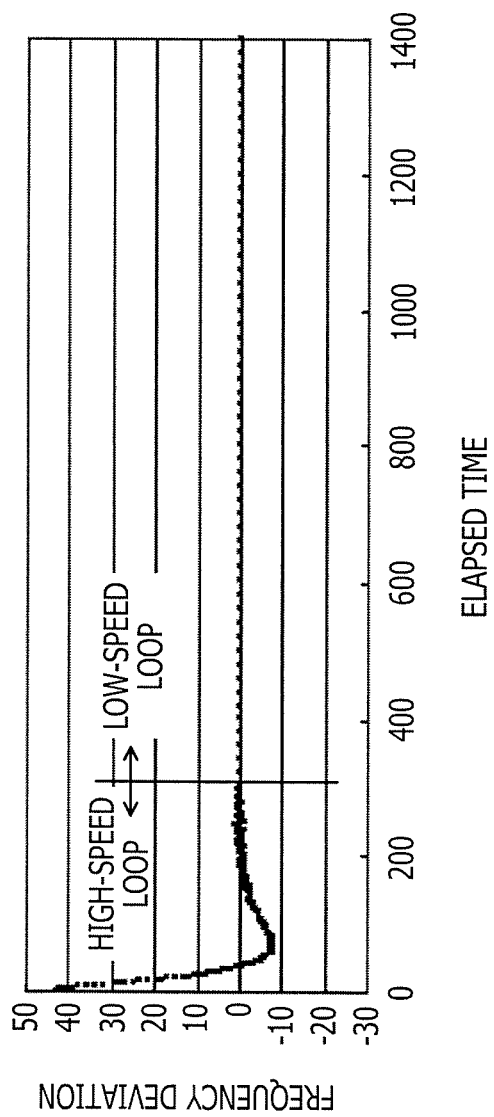
FIG. 18 is a graphic chart illustrating a change in a frequency of an output signal, based on a general PLL circuit, at the time of being locked with an input signal.

FIG. 18 is a graphic chart illustrating a change in a frequency of an output signal, based on a general PLL circuit, at the time of being locked with an input signal. A horizontal axis is an elapsed time (the number of points), a vertical axis is a frequency deviation, and the center is a deviation of 0 (ppm). An example of an input signal including no gap is illustrated. It is an example in which high-speed entrainment (a high-speed loop operation) is performed before 300 points while setting a cutoff frequency of the PLL to 100 Hz and the cutoff of the PLL is lowered to 1 Hz serving as a target (a low-speed loop operation) after 300 points. In this example, loop switching is performed with the aim of configuring the PLL whose loop band is 1 Hz at the time of being steady. As illustrated in FIG. 18, even if loop switching is performed on the input signal including no gap, no problems occur with a characteristic of a change in output frequency at the time of being locked.

Figure 19:
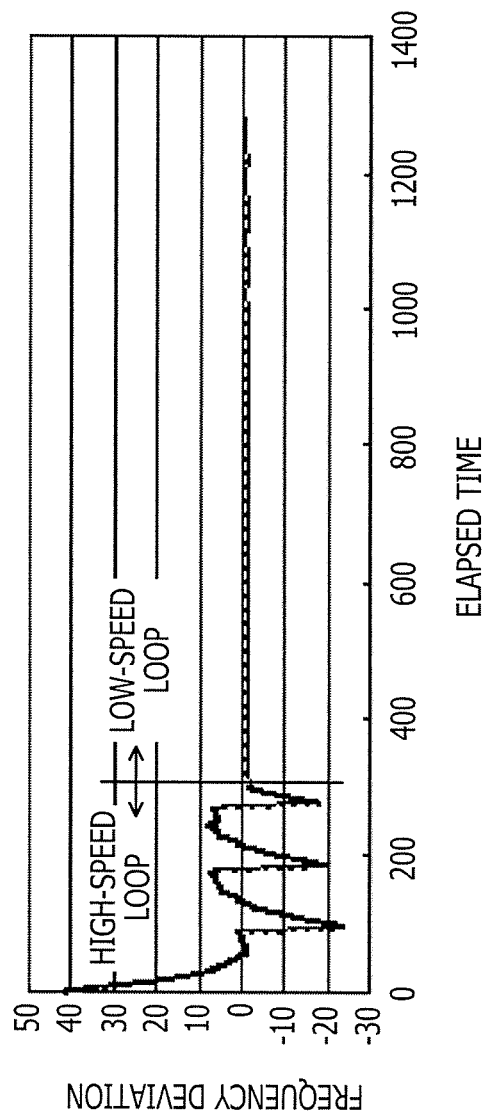
FIG. 19 is a graphic chart illustrating a change in a frequency of an output signal, based on a general PLL circuit, at the time of being locked with an input signal including gaps.

FIG. 19 is a graphic chart illustrating a change in a frequency of an output signal, based on a general PLL circuit, at the time of being locked with an input signal including gaps. In a case where the input signal includes gaps, locking in a state in which an input frequency widely varies is performed as illustrated in FIG. 19.

As illustrated in FIG. 19, in a case where a deviation of an output frequency at the time of switching from a high-speed loop operation to a low-speed loop operation is nearly "0", no problems occur with a characteristic of an output frequency variation after the switching of a loop, in the same way as at the time of being locked with an input including no gap.

Figure 20:
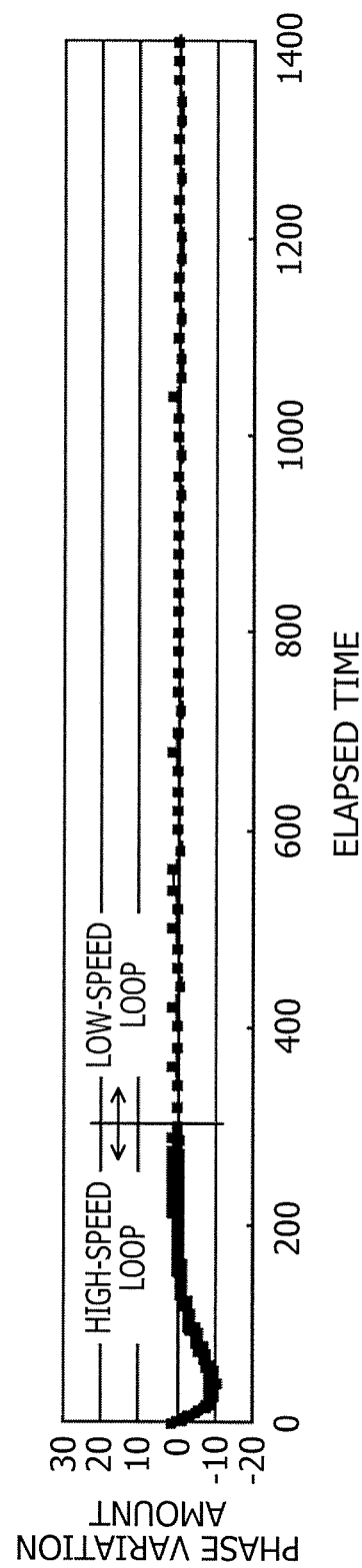
FIG. 20 is a graphic chart illustrating a change in input-output phase difference in a locking process in an input signal including no gap.

FIG. 20 is a graphic chart illustrating a change in input-output phase difference in a locking process in an input signal including no gap. A vertical axis is a phase variation amount, and a horizontal axis is a time. As illustrated in the drawing, in the input signal including no gap, the phase variation amount is converged to a phase difference of "0" after switching from a high-speed loop operation to a low-speed loop operation.

Figure 21:
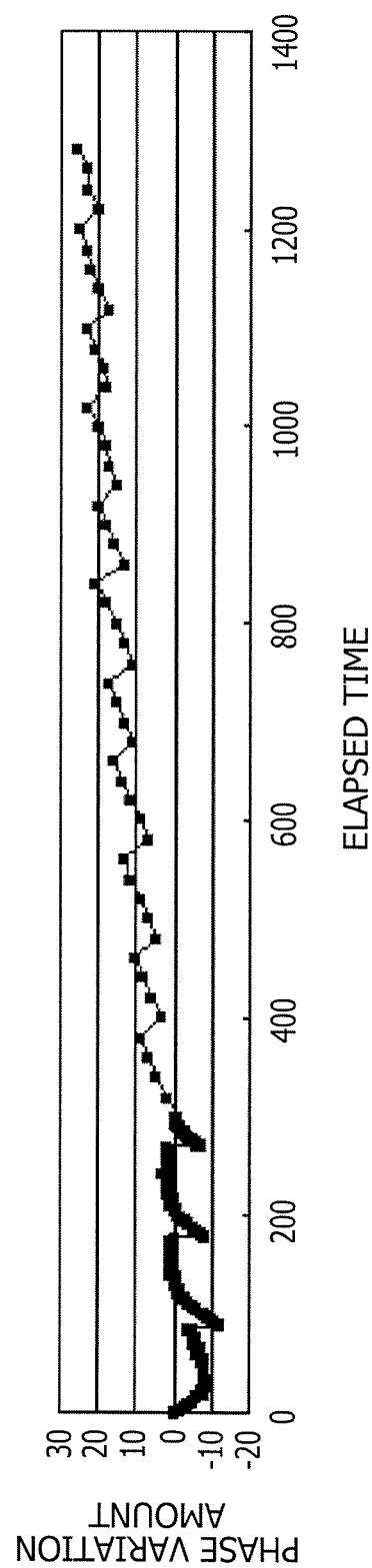
FIG. 21 is a graphic chart illustrating a change in input-output phase difference in a locking process in an input signal including gaps.

FIG. 21 is a graphic chart illustrating a change in input-output phase difference in a locking process in an input signal including gaps. As described above, in the input signal including gaps, in some cases, depending on the timing of a gap included in the input signal, there is a characteristic in which phase locking is lost once and is re-converged after switching from the high-speed loop operation to the low-speed loop operation. In the case of FIG. 21, re-convergence is established after the elapse of a time period, not illustrated.

In the case of FIG. 21, switching to the low-speed loop operation is performed in a state in which sufficient convergence is not established with the cutoff of 100 Hz (the high-speed loop operation), and a phase variation after transitioning to 1 Hz (a low-speed loop) grows wider. In such a phase variation, it is desirable to increase the number of stages of a FIFO (the Rx FIFO 1501 in FIG. 15) storing therein data for convenience of a system.

Note that while a method for lowering a cutoff frequency at the time of the high-speed loop operation to a frequency less than 100 Hz in order to suppress a phase variation based on gaps may be considered, a entrainment time period increases, and high-speed locking performance is deteriorated. In addition, in Japanese Laid-open Patent Publication No. 4-100412, described above, the influence of a gap causes the phase-converged state to be difficult to determine. In addition, in Japanese Laid-open Patent Publication No. 7-142999, the influence of a gap causes the control voltage of the VCO to deviate out of the threshold value. Therefore, every time the control voltage of the VCO deviates, the counter for generating the filter switching signal is reset, and it is difficult to output a timing for switching a filter.

In contrast, in each of the embodiments, at the time of switching a loop, after the elapse of a given period of time in a high-speed loop in the entrainment process, it is determined whether a phase jump based on a gap of an input signal occurs, and in accordance with a determination result, the filter coefficients are switched to a low-speed loop. From this, even in a case of an input signal including a gap, it is possible to perform high-speed entrainment, no phase variation occurs after switching a loop to that at the time of being steady, and it is possible to balance the high-speed entrainment and the suppression of the phase variation with each other.

In addition, in each of the embodiments, a configuration in which the loop filter switches between the two loop characteristics of the high-speed loop characteristic and the low-speed loop characteristic is adopted. However, each of the embodiments is not limited to this and may be applied to a configuration in which a loop filter has loop characteristics (for example, a high-speed loop characteristic, a medium-speed loop characteristic, and a low-speed loop characteristic at the time of being steady). Based on the loop characteristics, it is possible to further stabilize a fluctuation (a frequency variation) at the time of convergence. In addition, even in a case of having the loop characteristics, switching to a loop characteristic of a final transition state (for example, from the medium-speed loop characteristic to the low-speed loop characteristic) in the switched loop characteristics is performed at the timing illustrated in each of the above-mentioned embodiments. From this, even in a case of an input signal including a gap, it is possible to perform high-speed entrainment at the time of activation. In addition, no phase variation occurs after switching a loop to the low-speed loop characteristic at the time of being steady.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A phase locked loop circuit comprising:
a loop filter having a high cutoff characteristic and a low cutoff characteristic that are switchable; and
a switching circuit configured to:
detect a timing when an irregular gap of no signal, included in an input signal, does not occur, and
switch, in the detected timing, a cut off characteristic of the loop filter from the high cutoff characteristic during entrainment of phase locking of an output signal with the input signal to the low cut off characteristic after the phase locking.

2. The phase locked loop circuit according to claim 1, wherein
the switching circuit is further configured to determine a direction of the entrainment of the phase locking, and detect a maximum value or a minimum value of an output of the loop filter, and
wherein the cut off characteristic of the loop filter is switched based on the determined direction and the detected maximum value or the detected minimum value.

3. The phase locked loop circuit according to claim 2, wherein
the direction of the entrainment is determined when the output of the loop filter continues to increase or continues to decrease.

4. The phase locked loop circuit according to claim 2, wherein
the switching circuit is further configured to set a threshold, the threshold being set based on the detected maximum value when the determined direction is positive and based on the detected minimum value when the determined direction is negative, and
the timing is detected based on comparison of the output of the loop filter with the set threshold.

5. The phase locked loop circuit according to claim 1, wherein
the switching circuit is further configured to repeatedly measure the output of the loop filter, and determine a difference between the measured output of the loop filter and a previous output of the loop filter that is measured prior to the measured output of the loop filter, and
wherein the timing is detected based on the determined difference.

6. The phase locked loop circuit according to claim 5, wherein
the detected timing is a timing when the determined difference continues to be smaller than a specified value that is set based on a difference between the previous output of the loop filter and the output of the loop filter that is generated in response to the input signal including a gap.

7. A phase locked loop circuit comprising:
a memory; and
a processor coupled to the memory and configured to:
implement a loop filter having a high cutoff characteristic and a low cutoff characteristic that are switchable,
detect a timing when an irregular gap of no signal, included in an input signal, does not occur, and
switch, in the detected timing, a cut off characteristic of the loop filter from the high cutoff characteristic during entrainment of phase locking of an output signal with the input signal to the low cut off characteristic after the phase locking.

8. A phase locked loop method comprising:
detecting a timing when an irregular gap of no signal, included in an input signal, does not occur; and
switching, in the detected timing, a cut off characteristic of a loop filter having a high cutoff characteristic and a low cutoff characteristic that are switchable, from the high cutoff characteristic during entrainment of phase locking of an output signal with the input signal to the low cut off characteristic after the phase locking.

* * * * *